(12) United States Patent  
McCall

(10) Patent No.: US 6,748,038 B1  
(45) Date of Patent: Jun. 8, 2004

(54) METHOD AND CIRCUIT FOR DETERMINING SIGNAL AMPLITUDE

(75) Inventor: Kevin J. McCall, Lafayette, CO (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/415,545

(22) Filed: Oct. 8, 1999

(51) Int. Cl.$^7$ ............................................. H04L 27/08
(52) U.S. Cl. ........................................ 375/345; 702/73
(58) Field of Search ............................... 375/345, 344, 375/316; 702/73; 708/603

(56) References Cited

U.S. PATENT DOCUMENTS 4,210,781 A  *  7/1980  Nishimura et al. ......... 704/258  
4,620,160 A  * 10/1986  Waggener ................... 329/319  
5,448,424 A  *  9/1995  Hirano et al. ................. 360/65

* cited by examiner

Primary Examiner—Don N. Vo

(74) Attorney, Agent, or Firm—Steven Bongini; Lisa K. Jorgenson

(57) ABSTRACT

A method is provided for determining the actual amplitude of a signal relative to a predetermined amplitude. According to the method, two samples of the signal are squared to produce two squared samples, and the sum of the two squared samples minus the square of the predetermined amplitude is calculated to produce a difference of squares. A shift operation is performed on the difference of squares to determine a difference between the actual amplitude and the predetermined amplitude. In a preferred embodiment, two consecutive samples of the signal are taken at four times the frequency of the signal. Also provided is a circuit device that includes an A/D converter, a variable gain amplifier, and a feedback loop. The A/D converter converts an analog signal into a digital signal, and the variable gain amplifier adjusts the amplitude of the analog signal. The feedback loop controls the variable gain amplifier based on a difference between the amplitude of the analog signal and a predetermined amplitude. Further, the feedback loop calculates the difference by squaring two samples of the digital signal, summing the two squared samples and subtracting the square of the predetermined amplitude to produce a result, and shifting the result.

23 Claims, 4 Drawing Sheets

METHOD AND CIRCUIT FOR DETERMINING SIGNAL AMPLITUDE

BACKGROUND OF THE INVENTION

1. Field of the Invention

The present invention relates to electronic circuits, and more specifically to a method and circuit for determining the signal amplitude at the input of an analog-to-digital converter.

2. Description of Related Art

Today, electronic communication generally involves both analog signal processing and digital signal processing. Typically, an analog-to-digital (A/D) converter converts an initial analog signal into a digital signal for processing and transmittal, and then a digital-to-analog (D/A) converter converts the digital signal back into an analog signal for playback. A portion of an electronic communication circuit is shown in FIG. 1.

An analog input signal is first supplied to a variable gain amplifier 10 that performs gain correction and then to a continuous time filter 12 (e.g., a low-pass filter) that filters out unwanted components. An A/D converter 14 converts the output of the filter 12 into a digital signal, and then various processing is performed by a digital signal processor 16 to produce a digital output signal for transmission or playback. In order to minimize distortion and maximize the signal-to-noise ratio, the digital signal processor 16 calculates the optimum amplitude for the signal that is input to the A/D converter 14 and outputs a corresponding correction signal ERR to the variable gain amplifier 10.

However, due to the latency of such a feedback loop, the correction signal ERR must have a low bandwidth relative to the analog input signal. As a result, at the start of a signal burst or when there is a major change in the analog signal, the A/D converter must produce many digital samples before the automatic gain control feedback loop can modify the amplitude of the analog signal to the proper level. This is known as acquire-and-track because the automatic gain control feedback loop must first acquire the gain level needed to produce the desired amplitude and then track minor variations in the amplitude of the analog input signal. During the long time required to acquire the desired amplitude, the digital signal output by the A/D converter can be of poor quality or even unusable.

SUMMARY OF THE INVENTION

In view of these drawbacks, it is an object of the present invention to overcome the above-mentioned drawbacks and to provide a method for quickly determining the amplitude of an input signal.

Another object of the present invention is to provide an electronic communication circuit that can quickly adjust the amplitude of an analog input signal to a desired level.

One embodiment of the present invention provides a method for determining the actual amplitude of a signal relative to a predetermined amplitude. According to the method, two samples of the signal are squared to produce two squared samples, and the sum of the two squared samples minus the square of the predetermined amplitude is calculated to produce a difference of squares. A shift operation is performed on the difference of squares to determine a difference between the actual amplitude and the predetermined amplitude. In a preferred embodiment, two consecutive samples of the signal are taken at four times the frequency of the signal.

Another embodiment of the present invention provides a circuit device that includes an A/D converter, a variable gain amplifier, and a feedback loop. The A/D converter converts an analog signal into a digital signal, and the variable gain amplifier adjusts the amplitude of the analog signal. The feedback loop controls the variable gain amplifier based on a difference between the amplitude of the analog signal and a predetermined amplitude. Further, the feedback loop calculates the difference by squaring two samples of the digital signal, summing the two squared samples and subtracting the square of the predetermined amplitude to produce a result, and shifting the result. In one preferred embodiment, the feedback loop includes an arithmetic logic unit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
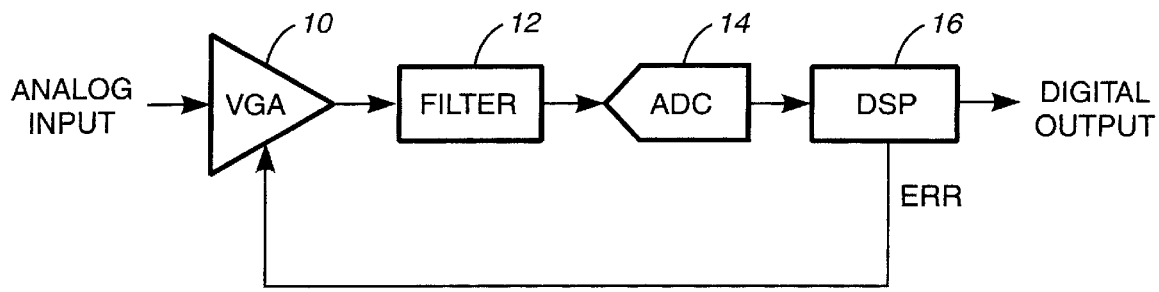
FIG. 1 is a block diagram showing a portion of an electronic communication circuit.

Preferred embodiments of the present invention will be described in detail hereinbelow with reference to the attached drawings.

When a sine wave is sampled at four times its frequency, the amplitude of the input signal can be determined from any two consecutive samples. More specifically, when a sine wave with amplitude A is sampled at four times its frequency, two consecutive samples are ¼ wave (or 90°) apart so their values are given by equations (1) and (2).

$$s_1 = A \sin(x) \tag{1}$$

$$s_2 = A \sin(x+90°) \tag{2}$$

Squaring both samples and then adding them together produces equation (3), and the right side of equation (3) can be reduced to equation (4).

$$s_1^2 + s_2^2 = (A \sin(x))^2 + (A \sin(x+90°))^2 \tag{3}$$

$$A^2(\sin^2(x) + \sin^2(x+90°)) \tag{4}$$

Additionally, the sine and cosine functions are related according to equations (5) and (6), and squaring both sides of equation (6) produces the relationship of equation (7).

$$\sin^2(x) + \cos^2(x) = 1 \tag{5}$$

$$\sin(x+90°) = \cos(x) \tag{6}$$

$$\sin^2(x+90°) = \cos^2(x) \tag{7}$$

Substituting the relationship of equation (7) into equation (4) produces equation (8).

$$A^2(\sin^2(x)+\cos^2(x)) \qquad (8)$$

Further, equation (5) reduces equation (8) to $A^2$. Thus, equation (3) can be rewritten as equation (9), and the amplitude of the input signal can be determined from two consecutive samples taken at four times the input frequency using equation (10).

$$s_1^2+s_2^2=A^2 \qquad (9)$$

$$A=sqrt(s_1^2+s_2^2) \qquad (10)$$

While equation (10) can be used to determine the amplitude of the input signal, the calculation requires two multiplications, an addition, and a square root operation. Furthermore, in a communication circuit of the type shown in FIG. 1, the goal is to use feedback to control the gain so that the input signal is at the optimum amplitude, as explained above. In particular, the actual amplitude A is said to be equal to the optimum (or desired) amplitude $A_o$ plus an amplitude error $\Delta$, and the variable gain amplifier is controlled based on this error. To determine the amplitude error $\Delta$, the relationship between the actual and optimum amplitudes is substituted into equation (10) to produce equation (11).

$$\Delta=sqrt(s_1^2+s_2^2)-A_o \qquad (11)$$

Thus, the communication circuit must perform two multiplications, an addition, a square root operation, and a subtraction to determine the amplitude error $\Delta$ from two samples of the input signal.

Embodiments of the present invention provide an improved method for determining the amplitude error that does not require a square root operation. If the optimum (or desired) amplitude $A_o$ is $2^N$, then the actual amplitude A is equal to $2^N+\Delta$. Substituting this value into equation (9) produces equation (12), which can be expanded to equation (13).

$$s_1^2+s_2^2=(2^N+\Delta)^2 \qquad (12)$$

$$s_1^2+s_2^2=2^{2N}+2\Delta2^N+\Delta^2 \qquad (13)$$

Next, the optimum amplitude squared $A_o^2$ is subtracted from both sides to give equation (14).

$$s_1^2+s_2^2-A_o^2=2^{2N}+2\Delta2^N+\Delta^2-A_o^2 \qquad (14)$$

Further, $A_o$ is $2^N$, so $A_o^2$ is $2^{2N}$. Thus, equation (14) can be rewritten as equation (15), and then the opposing $2^{2N}$ terms can be canceled from the right side to give equation (16).

$$s_1^2+s_2^2-A_o^2=2^{2N}+2\Delta2^N+\Delta^2-2^{2N} \qquad (15)$$

$$s_1^2+s_2^2-A_o^2=2\Delta2^N+\Delta^2 \qquad (16)$$

If the squared error term $\Delta^2$ is ignored, equation (17) is produced.

$$2\Delta2^N\equiv s_1^2+s_2^2 A_o^2 \qquad (17)$$

Solving equation (17) for the amplitude error $\Delta$ gives equation (18), which can be reduced to equation (19).

$$\Delta\equiv(s_1^2+s_2^2-A_o^2)/2(2^N) \qquad (18)$$

$$\Delta\equiv(s_1^2+s_2^2-A_o^2)/2^{N+1} \qquad (19)$$

Furthermore, in the binary number system, division by a multiple of two can be accomplished through a simple right shift operation. Thus, if the optimum amplitude $A_o$ is a constant that can be written as $2^N$, then equation (19) can be used to approximate the amplitude error $\Delta$ by performing two multiplications, an addition, a subtraction, and a right shift. The process is shown in detail in the flowchart of FIG. 2. First, two consecutive samples of the input signal are taken at four times its frequency (i.e., twice the Nyquist frequency) (step S10). Each of the samples is squared (i.e., multiplied by itself) (step S12), and then the resultant products are added and the optimum amplitude squared (a constant) is subtracted (step S14). The (approximate) amplitude error is then determined by shifting right by N+1 (step S16).

Figure 2:
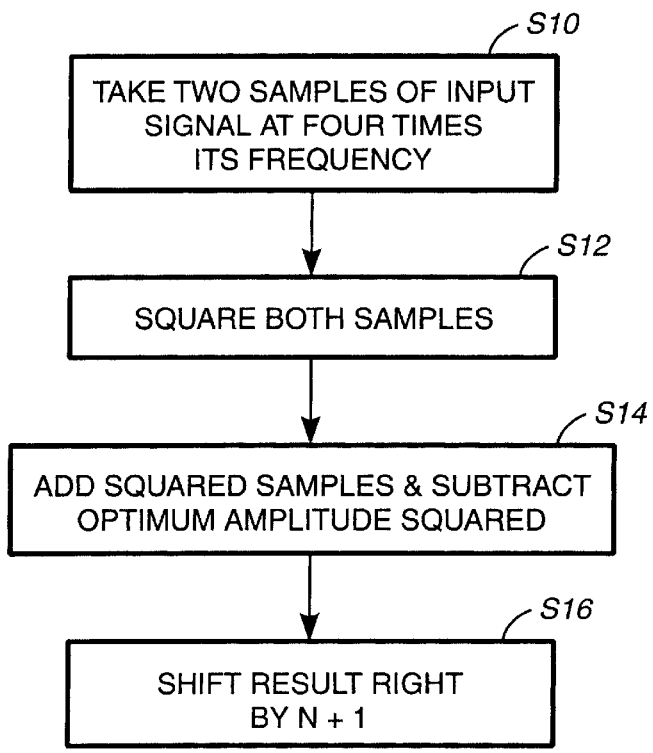
FIG. 2 is a flow chart of a method for determining signal amplitude in accordance with a preferred embodiment of the present invention.
Figure 3:
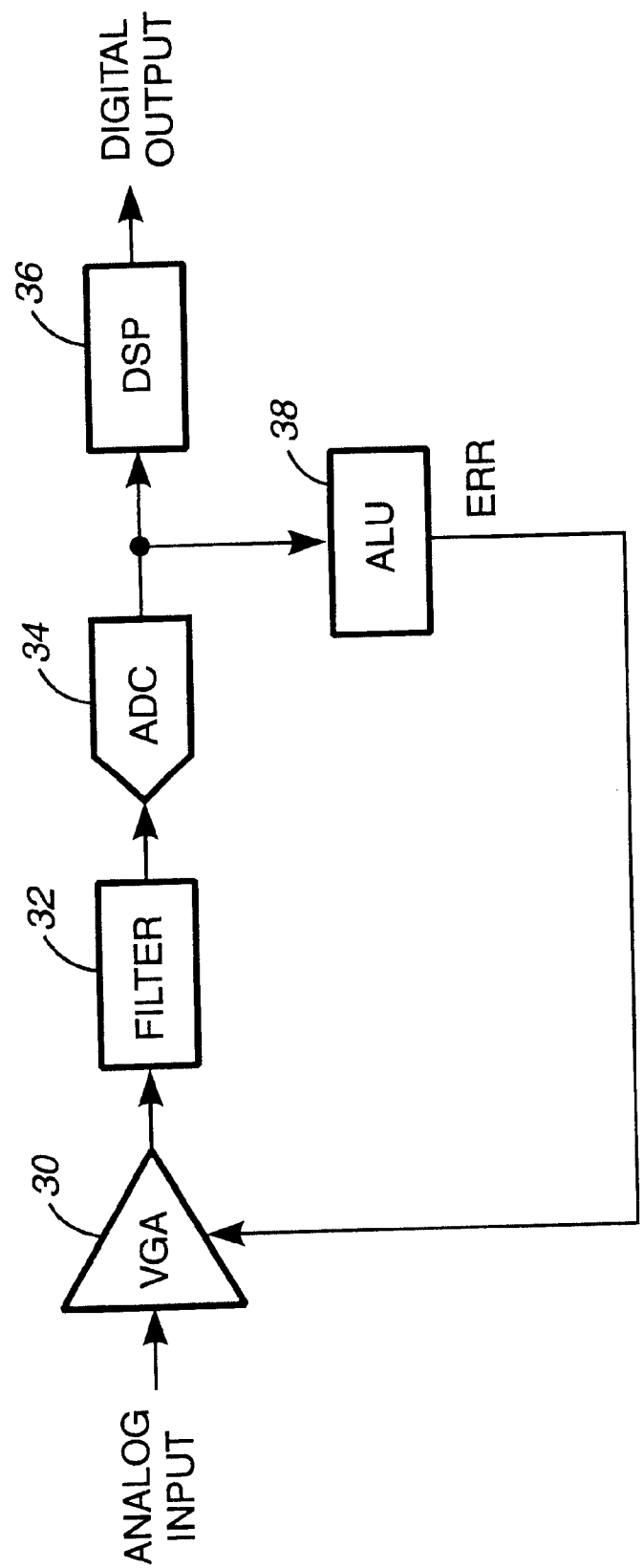
FIG. 3 is a block diagram showing one embodiment of a circuit for implementing the method of FIG. 2.

FIG. 3 shows a portion of a communication circuit for implementing the method of FIG. 2. As shown, an analog input signal is first supplied to a variable gain amplifier 30 that performs gain correction and then to a continuous time filter 32 (e.g., a low-pass filter) that filters out unwanted components. An A/D converter 34 converts the output of the filter 32 into a digital signal, and then various processing is performed by a digital signal processor 36 to produce a digital output signal (e.g., for transmission or playback). Additionally, an arithmetic logic unit (ALU) 38 receives the output of the A/D converter 34 and outputs a correction signal ERR to the variable gain amplifier 30.

In particular, the ALU 38 uses the method of the present invention to calculate the amplitude error in the signal that is input to the A/D converter 34, and generates the correction signal ERR based on the calculated amplitude error. Because the method of the present invention allows the ALU to determine the amplitude error from only two samples and without performing a square root operation, the required execution time is greatly reduced. Thus, the latency of the feedback loop is reduced and the amplitude of an analog input signal can be quickly adjusted to reduce distortion and increase the signal-to-noise ratio.

In other words, the long "acquire" time required by conventional circuits is circumvented by taking two (or more) samples from the A/D converter, determining the amplitude of the input signal relative to a desired amplitude, and then supplying a correction signal to control the gain in an "open-loop" manner. Further, the substitution of a simple shift right for the square root operation greatly reduces the size and complexity of the circuitry and the current consumption. In further embodiments, the calculation of the amplitude error and generation of the correction signal is performed by logic circuitry or by the DSP.

Additionally, the approximated amplitude error calculated in accordance with the present invention is identical to the actual amplitude error within a finite range. For example, Table 1 shows a comparison of the approximated and actual amplitude errors for an illustrative case in which N=4, and thus the desired amplitude $A_o$ (i.e., $2^N$) is 16. As shown, the approximated amplitude error is equal to the actual amplitude error as long as the actual amplitude is not off of the desired amplitude by more than 5 (or about 30%). In general, the approximated value is off by the actual value squared $\Delta^2$ divided by $2^{N+1}$ because the squared error term was dropped from equation (16).

Figure 4:
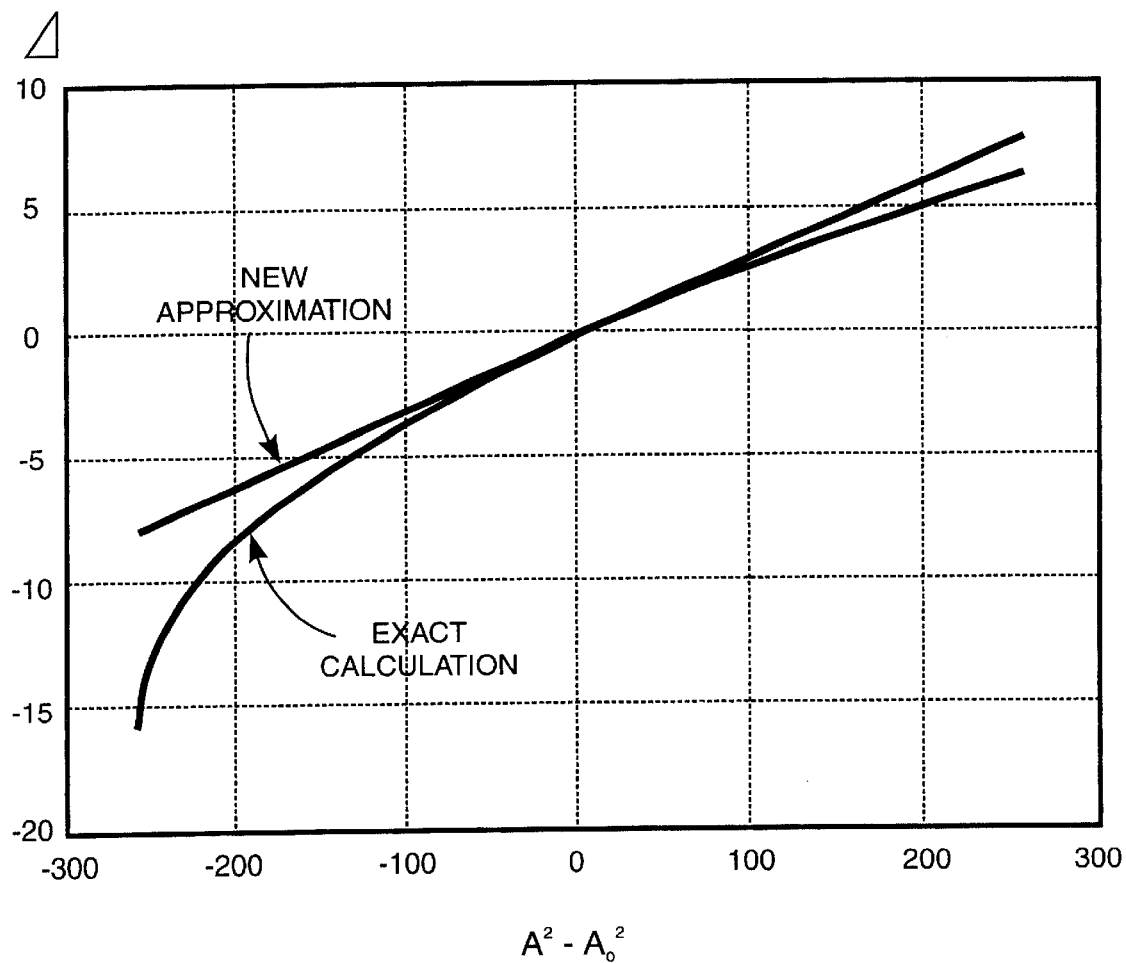
FIG. 4 is a graph showing a comparison of the actual amplitude error and the approximated amplitude error.
Figure 5:
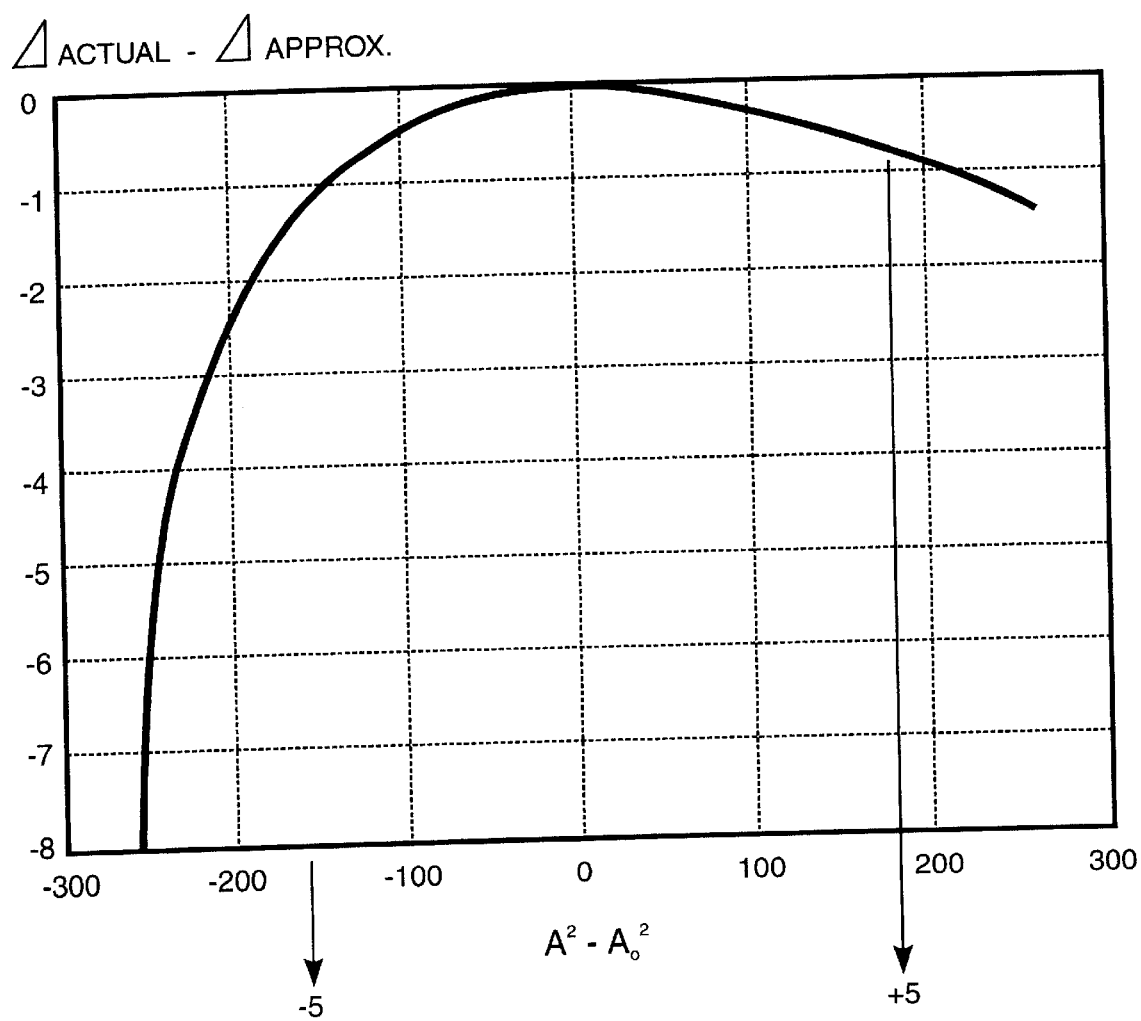
FIG. 5 is a graph showing the error made by the approximating the amplitude error.

FIG. 4 shows a comparison of the actual amplitude error and the approximated amplitude error for the exemplary case of Table 1, and FIG. 5 plots the error made by approximating the amplitude error as a function of $A^2-A_o^2$ (i.e., the difference in the squared amplitudes). As shown, a detectable error of 1 in the calculation does not emerge until the actual amplitude differs from the desired amplitude by more than 5.

TABLE 1

| A | $A^2$ | $A^2 - A_0^2$ | Shifted N + 1 | $\Delta_{approx}$ | $\Delta_{actual}$ |
|---|---|---|---|---|---|
| 22 | 484 | 228 | 0111b | 7 | 6 |
| 21 | 441 | 185 | 0101b | 5 | 5 |
| 20 | 400 | 144 | 0100b | 4 | 4 |
| 19 | 361 | 105 | 0011b | 3 | 3 |
| 18 | 324 | 68 | 0010b | 2 | 2 |
| 17 | 289 | 33 | 0001b | 1 | 1 |
| 16 | 256 | 0 | 0000b | 0 | 0 |
| 15 | 225 | −31 | 1111b | −1 | −1 |
| 14 | 196 | −60 | 1110b | −2 | −2 |
| 13 | 169 | −87 | 1101b | −3 | −3 |
| 12 | 144 | −112 | 1100b | −4 | −4 |
| 11 | 121 | −135 | 1011b | −5 | −5 |
| 10 | 100 | −156 | 1011b | −5 | −6 |

The signal amplitude determination method of the present invention is particularly suited for quickly acquiring the appropriate gain level during the preamble portion of a signal. More specifically, most analog signals (e.g., those used in satellite communication and in disk drives) include a sinusoidal preamble portion at the start of each data package. The receiving circuitry uses the sinusoidal preamble to perform the necessary timing and gain recovery functions so that the subsequent data portion of the signal can be accurately processed. While the above-described equations relate to a sinusoidal signal and may not operate properly with a multi-spectral signal such as a square wave, the method provides a fast open loop method that can reduce the initial acquire time by 10 or even 100 times. For example, preferred embodiments can quickly determine the proper gain level after just two signal samples. After the initial gain level is acquired, other means can optionally be used to track the minor variations in the multi-spectral portion of the signal.

The amplitude determination method of the present invention can be implemented in hardware, software, or a combination of the two. For example, at least a portion of the method can be embodied in software programs that are stored on a computer-readable medium (e.g., magnetic disk, optical disk, or non-volatile memory) for execution by a computer. Further, while the embodiments described above relate to an amplitude determination method performed at the output of an A/D converter, one of ordinary skill in the art could embody the amplitude determination method of the present invention in hardware that does not include an A/D converter (e.g., a completely digital communication circuit or a digital data processing circuit).

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method for determining actual amplitude of a signal relative to a predetermined amplitude, said method comprising the steps of:

squaring two samples of the signal to produce two squared samples;

calculating the sum of the two squared samples minus the square of the predetermined amplitude to produce a difference of squares; and performing a shift operation on the difference of squares to determine a difference between the actual amplitude and the predetermined amplitude.

2. The method as defined in claim 1, further comprising the step of taking two consecutive samples of the signal at four times a frequency of the signal.

3. The method as defined in claim 1, further comprising the step of adding the difference between the actual amplitude and the predetermined amplitude to the predetermined amplitude to calculate the actual amplitude.

4. The method as defined in claim 1, wherein in the step of performing a shift operation, the shift operation is a binary right shift operation by an amount that is a function of the predetermined amplitude.

5. The method as defined in claim 1, further comprising the step of adjusting a gain of the signal based on the difference between the actual amplitude and the predetermined amplitude.

6. The method as defined in claim 1, wherein the signal is an analog signal and the samples are obtained by converting the analog signal into a digital signal.

7. The method as defined in claim 1, further comprising the step of changing the predetermined amplitude to another predetermined amplitude.

8. A machine-readable medium encoded with a program for determining actual amplitude of a signal relative to a predetermined amplitude, said program containing instructions for performing the steps of:

squaring two samples of the signal to produce two squared samples;

calculating the sum of the two squared samples minus the square of the predetermined amplitude to produce a difference of squares; and performing a shift operation on the difference of squares to determine a difference between the actual amplitude and the predetermined amplitude.

9. The machine-readable medium as defined in claim 8, wherein said program further contains instructions for performing the step of taking two consecutive samples of the signal at four times a frequency of the signal.

10. The machine-readable medium as defined in claim 8, wherein said program further contains instructions for performing the step of adding the difference between the actual amplitude and the predetermined amplitude to the predetermined amplitude to calculate the actual amplitude.

11. The machine-readable medium as defined in claim 8, wherein in the step of performing a shift operation, the shift operation is a binary right shift operation by an amount that is a function of the predetermined amplitude.

12. The machine-readable medium as defined in claim 8, wherein said program further contains instructions for performing the step of adjusting a gain of the signal based on the difference between the actual amplitude and the predetermined amplitude.

13. The machine-readable medium as defined in claim 8, wherein the signal is an analog signal and the samples are obtained by converting the analog signal into a digital signal.

14. The machine-readable medium as defined in claim 8, wherein said program further contains instructions for performing the step of changing the predetermined amplitude to another predetermined amplitude.

15. A circuit device comprising:
an analog-to-digital (A/D) converter for converting an analog signal into a digital signal;
a variable gain amplifier for adjusting amplitude of the analog signal; and
a feedback loop controlling the variable gain amplifier based on a difference between the amplitude of the analog signal and a predetermined amplitude,
wherein the feedback loop calculates the difference by squaring two samples of the digital signal, summing the two squared samples and subtracting the square of the predetermined amplitude to produce a result, and shifting the result.

16. The circuit device as defined in claim 15, wherein the feedback loop includes an arithmetic logic unit.

17. The circuit device as defined in claim 15, wherein the feedback loop includes a digital signal processor.

18. The circuit device as defined in claim 15, wherein the feedback loop includes logic circuits.

19. The circuit device as defined in claim 15, wherein the A/D converter samples the analog signal at four times a frequency of the analog signal.

20. The circuit device as defined in claim 15, wherein the shift performed by the feedback loop is a binary right shift operation by an amount that is a function of the predetermined amplitude.

21. The circuit device as defined in claim 15, wherein the predetermined amplitude can be changed.

22. The method as defined in claim 1, wherein in the step of performing a shift operation, the shift operation is a binary right shift operation.

23. The method as defined in claim 1, wherein in the step of performing a shift operation, the shift operation is by an amount that is a function of the predetermined amplitude.

* * * * *